(12) United States Patent
Lo et al.

(10) Patent No.: US 7,218,525 B2
(45) Date of Patent: May 15, 2007

(54) FASTENER FOR HEAT SINK

(75) Inventors: Wei-Ta Lo, Tu-Cheng (TW); Yi-Qiang Wu, Shenzhen (CN)

(73) Assignees: Fu Zhün Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 296 days.

(21) Appl. No.: 10/955,311

(22) Filed: Sep. 30, 2004

(65) Prior Publication Data

US 2005/0254217 A1    Nov. 17, 2005

(30) Foreign Application Priority Data

May 13, 2004    (CN) .................. 2004 2 0045939

(51) Int. Cl.
*H05K 7/20*    (2006.01)
(52) U.S. Cl. ....................................... 361/719; 257/719
(58) Field of Classification Search ................ 361/719; 257/719
See application file for complete search history.

(56) References Cited

U.S. PATENT DOCUMENTS

| 6,061,248 A  * | 5/2000  | Otani et al. ................. 361/777 |
| 6,219,244 B1   | 4/2001  | Chen .......................... 361/704 |
| 6,304,452 B1 * | 10/2001 | Lo ............................. 361/704 |

FOREIGN PATENT DOCUMENTS

| CN | 98200376.5  | 10/1999 |
| CN | 00231377.4  | 2/2001  |
| TW |    465909   | 11/2001 |
| TW |    478721   | 3/2002  |

\* cited by examiner

*Primary Examiner*—Greg Thompson
(74) *Attorney, Agent, or Firm*—Morris Manning & Martin LLP; Tim Tingkang Xia, Esq.

(57) ABSTRACT

A fastener for mounting a heat sink on a chip mounted on a printed circuit board includes a cylindrical spring member and a locking member. The locking member includes a pair of action portions extending through the spring member, an elastic insertion portion formed at the bottom of the action portions and located beneath the spring member, and a pair of spaced hooking portions formed from the action portions and engaged with the spring member.

14 Claims, 3 Drawing Sheets

FASTENER FOR HEAT SINK

TECHNICAL FIELD

The present invention relates to a fastener, and particularly to a fastener for mounting a heat sink to a heat generating unit.

BACKGROUND

As integrated circuit technology continues to advance, electronic components such as chips of computers are made to provide faster operational speeds and greater functional capabilities. When a chip operates at a high speed in a computer enclosure, its temperature usually increases greatly. It is desirable to dissipate the generated heat quickly, for example, by using a heat sink attached to the chip in the enclosure. This allows the chip and other high-performance electronic components in the enclosure to function within their normal operating temperature ranges. Oftentimes, fasteners are required for mounting the heat sink to the chip.

Chinese Patent No. ZL 98200376.5 discloses a locking device for mounting a heat sink to a chip mounted on a printed circuited board. The heat sink and the printed circuited board commonly define several pairs of aligned holes around the chip. The locking device comprises several fasteners. Each fastener comprises a spring and a plastic pin. The pin comprises a top portion, an end portion and a shank connecting the top portion with the end portion. The end portion is formed in the shape of a cone with an engaging end having a diameter larger than that of the corresponding hole of the printed circuit board. The shank of each pin is surrounded by the corresponding spring. In use, the end portions of the pins are extended through the corresponding holes of the heat sink and the printed circuit board and engaged beneath the printed circuit board. In this way, the heat sink is mounted on the chip. However, in order to manufacture the pins, a mold is required. The cost for building the mold is usually high. On the other hand, the pins made by plastic material are not heat-resistant. Therefore, the shape of the pin is possibly changed in a high temperature condition, and any deformation of the pin results that the heat sink is not capable of firmly contacting the chip, and thereby reducing the heat dissipating efficiency of the heat sink.

SUMMARY OF THE INVENTION

Accordingly, an object of the present invention is to provide a fastener which has simple structure and low cost for manufacturing.

To achieve the above-mentioned object, a fastener in accordance with the present invention for mounting a heat sink on a heat generating unit mounted on a printed circuit board comprises a cylindrical spring member and a locking member. The locking member comprises a pair of action portions extending through the spring member, an elastic insertion portion formed at the bottom of the action portions and located beneath the spring member, and a pair of spaced hooking portions formed from the action portions and engaged with the spring member.

Other objects, advantages and novel features of the present invention will be drawn from the following detailed description of a preferred embodiment of the present invention together with the attached drawings, in which:

DETAILED DESCRIPTION OF A PREFERRED EMBODIMENT

Figure 1:
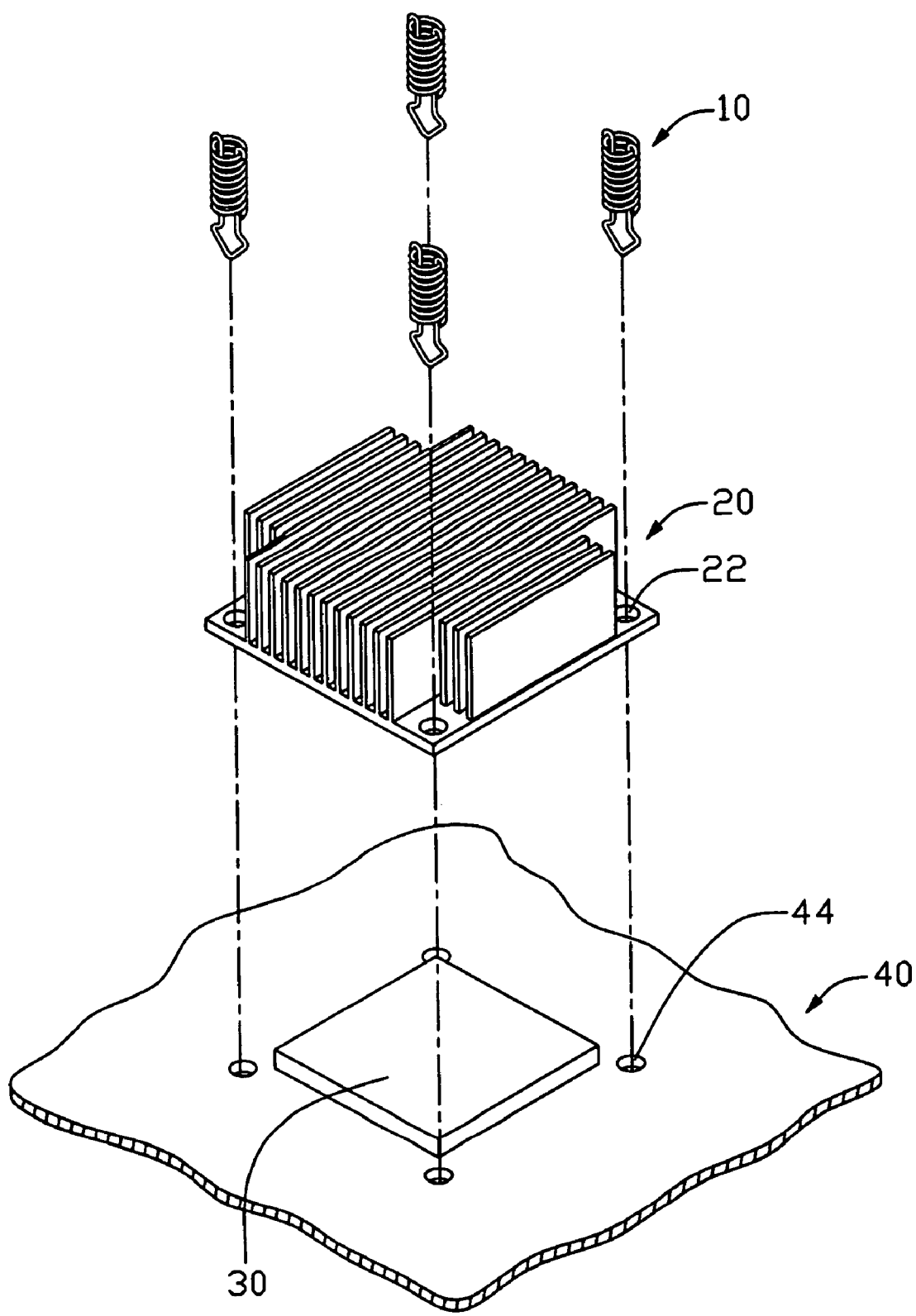
FIG. 1 is an isometric view of fasteners in accordance with a preferred embodiment of the present invention, together with a heat sink, a chip and a printed circuit board.

Referring to FIG. 1, a heat dissipating assembly including four fasteners 10 for mounting a heat sink 20 on a chip 30 mounted on a printed circuit board 40 is shown. The heat sink 20 defines four holes 22 at four corners thereof. The printed circuit board 40 defines four holes 44 around the chip 30 and corresponding to the holes 22 of the heat sink 20.

Figure 2:
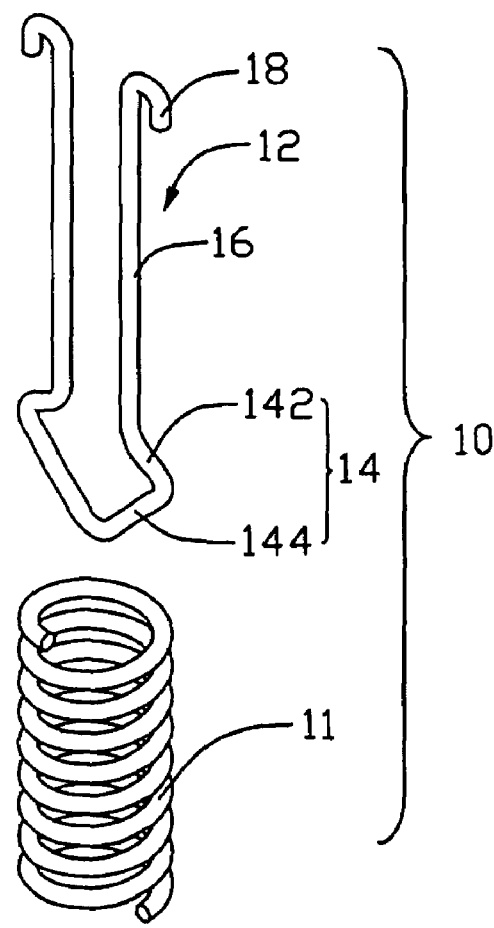
FIG. 2 is an exploded view of a fastener of FIG. 1.

Referring to FIG. 2, each fastener 10 comprises a cylindrical spring member 11 and a locking member 12. Each of the spring member 11 and the locking member 12 is integrally formed by bending a metallic winding wire. The diameter of the spring member 11 is larger than that of the corresponding hole 22 of the heat sink 20. The locking member 12 comprises two vertical-extending action portions 16. The top ends of the action portions 16 are bent outwardly and downwardly to form a pair of hooking portions 18. The bottom ends of the action portions 16 form an insertion portion 14. The insertion portion 14 comprises a pair of limiting sections 142 extending from the bottom ends of the action portions 16. The distance between the outmost points of the limiting portions 142 is larger than the diameter of the corresponding holes 22, 44 of the heat sink 20 and the printed circuit board 40. The limiting portions 142 extend downwardly and inwardly from the outmost points thereof and connect integrally to form a V-shaped insertion section 144. The action portions 16 extends through and are surrounded by the spring member 11. The hooking portions 18 hook over the top of the spring member 11, and the insertion portion 14 locates beneath the spring member 11.

Figure 3:
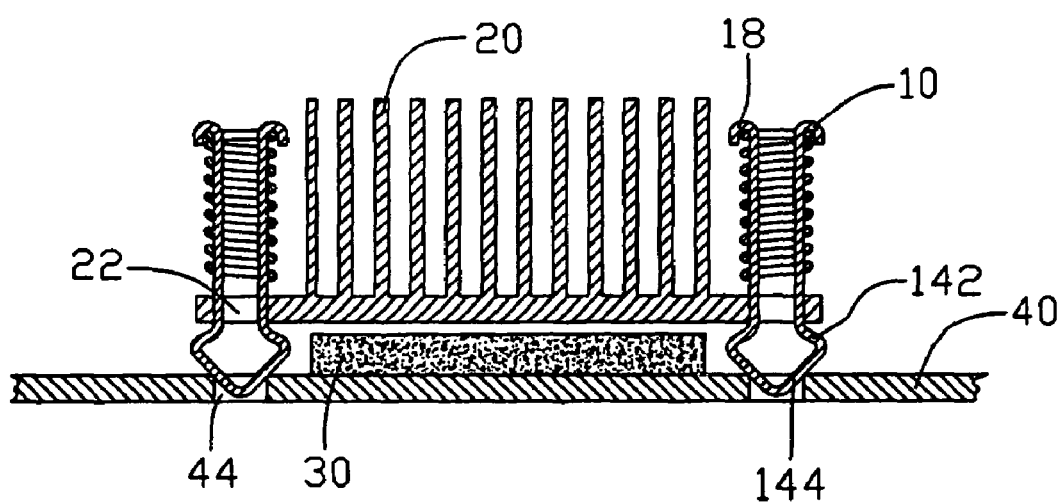
FIGS. 3–5 show the process of mounting the heat sink to the chip.
Figure 4:
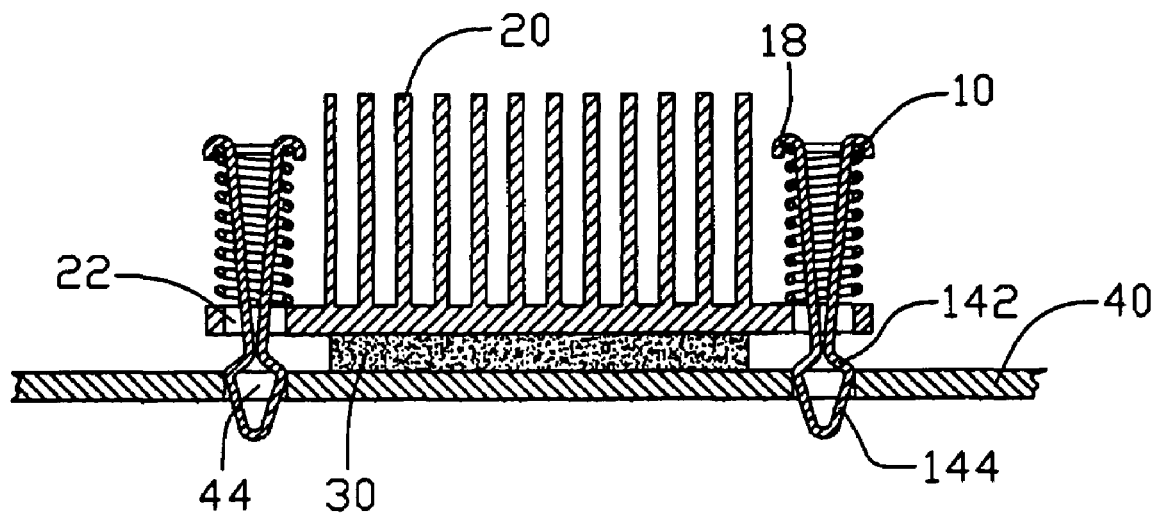
Figure 5:
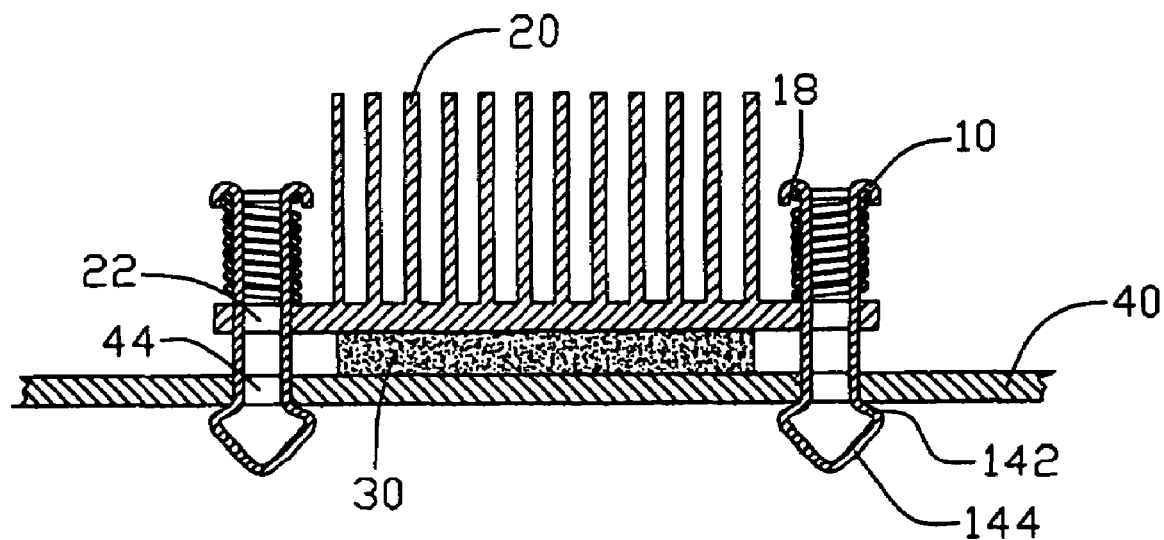

Referring to FIGS. 3–5, in assembly, the fasteners 10 are mounted to the heat sink 20 at the corresponding holes 22 thereof. The spring members 11 are located above the holes 22 of the heat sink 20 and the limiting sections 142 are located below the holes 22 of the heat sink 20. By virtue that the distance between the outmost points of the limiting sections 142 is larger than the diameter of the corresponding hole 22 of the heat sink 20 and the diameter of the spring member 11 is larger than that of the holes 22 of the heat sink 20, the fasteners 10 are pre-assembled to the heat sink 20. The heat sink 20 is placed on the chip 30 to have the holes 22 of the heat sink 20 aligned with the corresponding holes 44 of the printed circuit board 40. The insertion portions 14 are inserted through the corresponding holes 44 to be engaged beneath the holes 44 of the printed circuit board 40 by pressing the top of each fastener 10. Thus the process of mounting the heat sink 20 is completed. In this process, when the insertion portions 14 are moved through the holes 44 of the printed circuit board 40, the insertion portions 14 are compressed by the printed circuit board 40, which leads the lower sections of the action portions 16 to elastically shrink inwardly. After the limiting sections 142 of the insertion portions 14 move through the holes 44 of the print circuit board 40, the insertion portions 14 elastically stretch outwardly to return back to their original states. After the restoration of the insertion portion 144, the distance between the outmost points of the limiting sections 142 is again larger than the diameter of the holes 44 of the printed circuit board 40, so that the limiting sections 142 are held below the holes 44 of the printed circuit board 40. Since the diameter of the spring member 11 is larger than that of the hole 22 of the heat sink 20, the spring members 11 directly rest on the heat sink 20 above the holes 22 and are compressed between the heat sink 20 and the hooking portions 18 of the locking members 12 thereby exerting force onto the heat sink 20 toward the chip 30. The heat sink 20 thus tightly abuts against the chip 30.

When detaching the heat sink 20 from the chip 30, press the two action portions 16 of each fastener 10 inwardly until the distance between the outmost points of the limiting sections 142 is equal to the diameter of the corresponding holes 44 of the printed circuit board 40, and then remove the fastener 10 from the printed circuit board 40. After each fastener 10 is removed from the printed circuit board 40, detaching the heat sink 20 from the chip 30.

In the present invention, the fastener 10 is made from metallic winding wires. It does not require an expensive mold for manufacturing the fastener 10. Thus, the cost of the fastener 10 is lowered. Furthermore, the fastener 10 is heat-resistant in high temperature conditions. Moreover, it needs only to bend two metallic winding wires to form the spring member 11 and the locking member 12, the structure of the fastener 10 is therefore simple. In addition, the locking member 12 is discrete from the spring member 11. Thus the locking member 12 can cooperate with various spring members to fit various heat sinks.

It is understood that the invention may be embodied in other forms without departing from the spirit thereof. Thus, the present examples and embodiments are to be considered in all respects as illustrative and not restrictive, and the invention is not to be limited to the details given therein.

What is claimed is:

1. A fastener for mounting a heat sink on a heat generating unit mounted on a printed circuit board, comprising:
   a cylindrical spring member; and
   a locking member comprising a pair of action portions extending though the spring member, an elastic insertion portion formed at the bottom of the action portions and located beneath the spring member, and a pair of spaced hooking portions formed from the action portions and engaged with the spring member.

2. The fastener as described in claim 1, wherein each of the spring member and the locking member is integrally formed.

3. The fastener as described in claim 2, wherein each of the spring member and the locking member is integrally formed by bending a metallic wire.

4. The fastener as described in claim 2, wherein the insertion portion comprises a pair of limiting sections extending from the bottom ends of the action portions and a V-shaped insertion section extending downwardly from the limiting sections.

5. The fastener as described in claim 1, wherein the action portions of the locking member are surrounded by the spring member.

6. The fastener as described in claim 1, wherein the hooking portions are bent outwardly and downwardly from the top ends of the action portions and hook over the top of the spring member.

7. A heat dissipating assembly, comprising:
   a printed circuit board with a heat generating unit mounted thereon defining a plurality of holes around the heat generating unit;
   a heat sink mounted on the heat generating unit and defining holes aligned with the holes of the printed circuit board respectively; and
   a plurality of fasteners extending through corresponding holes of the heat sink and the print circuit board, each fastener comprising:
   a spring member resting on the heat sink; and
   a locking member discrete from the spring member, the bottom end of the locking member being engaged beneath a corresponding hole of the printed circuit board, the spring member being compressed between the heat sink and the locking member and exerting a force to the heat sink toward the heat generating unit;
   wherein the locking member comprises a pair of parallel action portions, an elastic insertion portion formed at the bottom ends of the action portions and located beneath the printed circuit board, and a pair of hooking portions formed at the top ends of the action portions and engaged on the top of the spring member.

8. The heat dissipating assembly as described in claim 7, each of the spring member and the locking member is integrally formed by bending a metallic wire.

9. The heat dissipating assembly as described in claim 7, wherein the spring member is cylindrical and surrounds the action portions, and the diameter of the spring member is larger than that of the corresponding hole of the heat sink.

10. The heat dissipating assembly as described in claim 7, wherein the insertion portion comprises a pair of limiting sections extending from the bottom ends of the action portions and a V-shaped insertion section extending downwardly from the limiting sections.

11. The heat dissipating assembly as described in claim 10, wherein the distance between the outmost points of the limiting sections is larger than the diameter of the corresponding bole of the printed circuit board.

12. The heat dissipating assembly as described in claim 7, wherein the hooking portions are bent outwardly and downwardly from the top ends of the action portions.

13. A fastener for a heat dissipating assembly securable to a heat generating unit of a printed circuit board, comprising:
   a spring member attachable on said heat dissipating assembly; and
   a discrete locking member extendable through said heat dissipating assembly and approachable to said printed circuit board, and having an end engagable with said printed circuit board, said locking member comprising at least two action portions retainable with said spring member, and movable with said spring member to result in a uniformly compressible status of said spring member against said heat dissipating assembly and uniformly forced engagement of said end with said printed circuit board;
   wherein each of said at least two action portions has a hooking portion to retain said spring member at one end thereof away from said heat dissipating assembly.

14. The fastener as described in claim 13, wherein said locking member is made of a metallic wire.

* * * * *

UNITED STATES PATENT AND TRADEMARK OFFICE
CERTIFICATE OF CORRECTION

PATENT NO. : 7,218,525 B2  Page 1 of 1
APPLICATION NO. : 10/955311
DATED : May 15, 2007
INVENTOR(S) : Wei-Ta Lo It is certified that error appears in the above-identified patent and that said Letters Patent is hereby corrected as shown below:

On the title page item (73), should read -- Fu Zhun Precision Industry (Shen Zhen) Co., Ltd., Shenzhen, Guangdong Province (CN); Foxconn Technology Co., Ltd., Tu-Cheng, Taipei Hsien (TW) --

Signed and Sealed this

Twenty-fifth Day of December, 2007

JON W. DUDAS
*Director of the United States Patent and Trademark Office*